US012777847B2

(12) United States Patent
Tanaka et al.

(10) Patent No.: US 12,777,847 B2
(45) Date of Patent: Oct. 27, 2026

(54) THERMOELECTRIC CONVERSION ELEMENT AND METHOD FOR MANUFACTURING THERMOELECTRIC CONVERSION ELEMENT

(71) Applicant: NITTO DENKO CORPORATION, Ibaraki (JP)

(72) Inventors: Hirokazu Tanaka, Ibaraki (JP); Yosuke Nakanishi, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 208 days.

(21) Appl. No.: 18/696,558

(22) PCT Filed: Sep. 27, 2022

(86) PCT No.: PCT/JP2022/036044
§ 371 (c)(1),
(2) Date: Mar. 28, 2024

(87) PCT Pub. No.: WO2023/054415
PCT Pub. Date: Apr. 6, 2023

(65) Prior Publication Data

US 2025/0017111 A1 Jan. 9, 2025

(30) Foreign Application Priority Data

Sep. 29, 2021 (JP) ................................ 2021-159972

(51) Int. Cl.
*H10N 15/20* (2023.01)
*H10N 15/00* (2023.01)

(52) U.S. Cl.
CPC ............ *H10N 15/20* (2023.02); *H10N 15/00* (2023.02)

(58) Field of Classification Search
CPC ........ H10N 15/00; H10N 15/20; H10N 15/10; H10N 15/15; H10N 10/00; H10N 10/01; H10N 10/10
(Continued)

(56) References Cited

U.S. PATENT DOCUMENTS

2014/0224293 A1 8/2014 Kirihara et al.
2014/0224294 A1* 8/2014 Koumoto .............. H10N 15/00 136/201
(Continued)

FOREIGN PATENT DOCUMENTS

JP 2014-72256 A 4/2014
JP 2015-142048 A 8/2015
(Continued)

OTHER PUBLICATIONS

The Extended European Search Report dated Aug. 1, 2025 for corresponding European Patent Application No. 22876281.1 (12 pages).
(Continued)

*Primary Examiner* — Alexander A Singh
(74) *Attorney, Agent, or Firm* — HAUPTMAN HAM, LLP

(57) ABSTRACT

A thermoelectric conversion element includes a thermoelectric conversion portion, a connection portion, and an extension portion. The thermoelectric conversion portion, which includes an electroconductive magnetic body having ferromagnetism or antiferromagnetism and exhibiting an anomalous Nernst effect, linearly extends. The connection portion includes an electroconductive body electrically connected to the thermoelectric conversion portion. The extension portion is formed of, for instance, a magnetic body extending from the thermoelectric conversion portion. In the thermoelectric
(Continued)

conversion element, for instance, the extension portion and the connection portion are layered.

11 Claims, 6 Drawing Sheets

(58) Field of Classification Search
USPC .......................................................... 310/306
See application file for complete search history.

(56) References Cited

U.S. PATENT DOCUMENTS

| | | | | |
|---|---|---|---|---|
| 2015/0194587 | A1* | 7/2015 | Kirihara | H10N 52/00 136/201 |
| 2024/0068881 | A1* | 2/2024 | Maeda | G01K 7/02 |

FOREIGN PATENT DOCUMENTS

| | | | |
|---|---|---|---|
| JP | 2018-113413 | A | 7/2018 |
| JP | 2020-98860 | A | 6/2020 |
| JP | 2021-128999 | A | 9/2021 |
| WO | 2013/046948 | A1 | 4/2013 |

OTHER PUBLICATIONS

Dong-Jun Kim et al., "Utilization of the Antiferromagnetic IrMn Electrode in Spin Thermoelectric Devices and Their Beneficial Hybrid for Thermopiles", Advanced Functional Materials, vol. 26, No. 30, May 30, 2016, pp. 5507-5514.

Dong-Jun Kim et al., "Utilization of the Antiferromagnetic IrMn Electrode in Spin Thermoelectric Devices and Their Beneficial Hybrid for Thermopiles—Supporting Information", Advanced Functional Materials, vol. 26, No. 30, Aug. 1, 2016 (11 pages).

Akito Sakai et al., "Iron-based binary ferromagnets for transverse thermoelectric conversion", Nature, vol. 581, No. 7806, Apr. 27, 2020 (18 pages).

International Search Report issued on Dec. 13, 2022, for corresponding International Patent Application No. PCT/JP2022/036044, along with an English translation (4 pages).

Written Opinion issued on Dec. 13, 2022, for corresponding International Patent Application No. PCT/ JP2022/036044, along with an English translation (6 pages).

Office Action issued on Nov. 28, 2025 for corresponding Korean Patent Application No. 10-2024-7010502, along with an English machine translation (14 pages).

Uchida et al., "Enhancement of anomalous Nernst effects in metallic multilayers free from proximity-induced magnetism", Physical Review B 92, 094414, 2015, 6 Pages.

Office Action dated Jul. 28, 2026, for the corresponding Japanese Patent Application No. 2023-551563, along with an English machine translation (Total 10 pages).

Communication pursuant to Article 94(3) EPC issued on Jul. 2, 2026 for corresponding European Patent Application No. 22 876 281.1 (6 pages).

* cited by examiner

THERMOELECTRIC CONVERSION ELEMENT AND METHOD FOR MANUFACTURING THERMOELECTRIC CONVERSION ELEMENT

CROSS REFERENCE TO RELATED APPLICATION

This application is a National Stage of International Application No. PCT/JP2022/036044, filed on Sep. 27, 2022, which designates the United States and was published in Japan, and which is based upon and claims priority to Japanese Patent Application No. 2021-159972, filed on Sep. 29, 2021 in the Japan Patent Office. All of the aforementioned applications are hereby incorporated by reference in their entireties.

TECHNICAL FIELD

The present invention relates to a thermoelectric conversion element and a method for manufacturing a thermoelectric conversion element.

BACKGROUND ART

Techniques related to thermoelectric conversion utilizing an anomalous Nernst effect or spin Seebeck effect have been known.

For instance, Patent Literature 1 describes a thermoelectric generation device utilizing an anomalous Nernst effect. The anomalous Nernst effect is a phenomenon that a voltage is generated in a direction orthogonal to both a magnetization direction and a temperature gradient when a temperature difference is caused by a heat flow through a magnetic body.

This thermoelectric generation device includes a substrate, a power generation body and a connection body. The power generation body is formed of a plurality of thin wires disposed in parallel to each other along a surface of the substrate. The respective thin wires are formed by shaping an FePt thin film, and the respective thin wires are magnetized in their width direction. The connection body is formed of a plurality of thin wires disposed parallel to and between the respective thin wires of the power generation body along the surface of the substrate. The connection body is, for instance, formed of Cr as a non-magnetic body. Each thin wire of the connection body electrically connects one end part of each thin wire of the power generation body to an end part of a thin wire adjacent on one side to the first-described thin wire. In this way, the connection body electrically connects the respective thin wires of the power generation body in series.

Patent Literature 2 describes a thermoelectric conversion element that utilizes a spin Seebeck effect. This thermoelectric conversion element includes a substrate, a magnetic body layer, an electroconductive film, a pair of terminals, and a pair of external connection wirings. For a material of the magnetic body layer, for instance, an oxide of yttrium iron garnet (YIG) or the like is used.

CITATION LIST

Patent Literature

[Patent Literature 1] JP 2014-72256 A
[Patent Literature 2] WO 2013/46948

SUMMARY OF INVENTION

Technical Problem

In monitoring of physical condition in the Internet of Things (IoT) society or in thermal management in the technical field such as batteries for electric vehicle (EV) or chips for high-speed data processing, the needs for heat monitoring have been increased. For complying with such needs, use of a thermoelectric conversion element for thermal sensing may be taken into consideration.

As a thermoelectric conversion element, a thermoelectric conversion element that utilizes the anomalous Nernst effect as described in Patent Literature 1, or a thermoelectric conversion element that utilizes the spin Seebeck effect as described in Patent Literature 2 are known, in addition to the thermoelectric conversion element that utilizes the Seebeck effect. The thermoelectric conversion element that utilizes the anomalous Nernst effect is considered to be more advantageous than the thermoelectric conversion element that utilizes the Seebeck effect from the viewpoint of mass production and flexibility. On the other hand, the thermoelectric conversion element that utilizes the spin Seebeck effect uses an oxide such as YIG as the material for the magnetic body layer, which may not be advantageous from the viewpoint of mass production and flexibility. The reason is as follows. In a case of forming a magnetic body layer by sputtering, the film formation rate in sputtering using an oxide as a target material is lower than that in sputtering using a metal as a target material, and this may make it difficult to increase the thickness of the magnetic body layer.

In the thermoelectric generation device described in Patent Literature 1, a power generation body formed of a plurality of thin wires and a connection body formed of a plurality of thin wires are electrically connected to each other. On the other hand, Patent Literature 1 fails to give any consideration to a crack resistance at a contact portion for electrical connection with the power generation body. In the thermoelectric conversion element described in Patent Literature 2, an oxide such as YIG is used as the material for the magnetic body layer. Oxides are often inferior to metals in terms of ductility and flexibility. Presumably therefore, disconnection is likely to occur if thin wires electrically connected in series are configured using a magnetic body of an oxide.

In view of such circumstances, the present invention provides a thermoelectric conversion element that is advantageous from the viewpoint of preventing or reducing occurrence of cracks at a contact portion for electrical connection with a thermoelectric conversion portion.

Solution to Problem

The Present Invention Provides a Thermoelectric Conversion Element Including:

a thermoelectric conversion portion including an electroconductive magnetic body and extending linearly, the electroconductive magnetic body having ferromagnetism or antiferromagnetism and capable of exhibiting an anomalous Nernst effect;

a connection portion including an electroconductive body and electrically connected to the thermoelectric conversion portion; and an extension portion formed of the electroconductive magnetic body extending from the thermoelectric conversion portion, or formed of the electroconductive body extending from the connection portion, wherein the extension portion formed of the electroconductive magnetic body extending from the thermoelectric conversion portion and the connection portion are layered, or the extension portion formed of the electroconductive body extending from the connection portion and the thermoelectric conversion portion are layered.

The present invention provides a method for manufacturing a thermoelectric conversion element, the method including:

forming a thermoelectric conversion portion, a connection portion, and an extension portion by etching a layered body including a first layer and a second layer, the first layer including an electroconductive magnetic body having ferromagnetism or antiferromagnetism and capable of exhibiting an anomalous Nernst effect, and the second layer including an electroconductive body,
 the thermoelectric conversion portion including the electroconductive magnetic body and linearly extending;
 the connection portion including the electroconductive body and being electrically connected to the thermoelectric conversion portion; and
 the extension portion being formed of the electroconductive magnetic body extending from the thermoelectric conversion portion or formed of the electroconductive body extending from the connection portion, wherein the thermoelectric conversion portion, the connection portion, and the extension portion are formed so that the extension portion formed of the electroconductive magnetic body extending from the thermoelectric conversion portion and the connection portion are layered, or that the extension portion formed of the electroconductive body extending from the connection portion and the thermoelectric conversion portion are layered.

Advantageous Effects of Invention

The thermoelectric conversion element described above is advantageous from the viewpoint of preventing or reducing occurrence of cracks at a contact portion for electrical connection with a thermoelectric conversion portion.

DESCRIPTION OF EMBODIMENTS

Hereinafter, embodiments of the present invention will be described with reference to the attached drawings. It should be noted that the present invention is not limited to the following embodiments. In the attached drawings, the X-axis, the Y-axis, and the Z-axis are orthogonal to each other.

Figure 1:
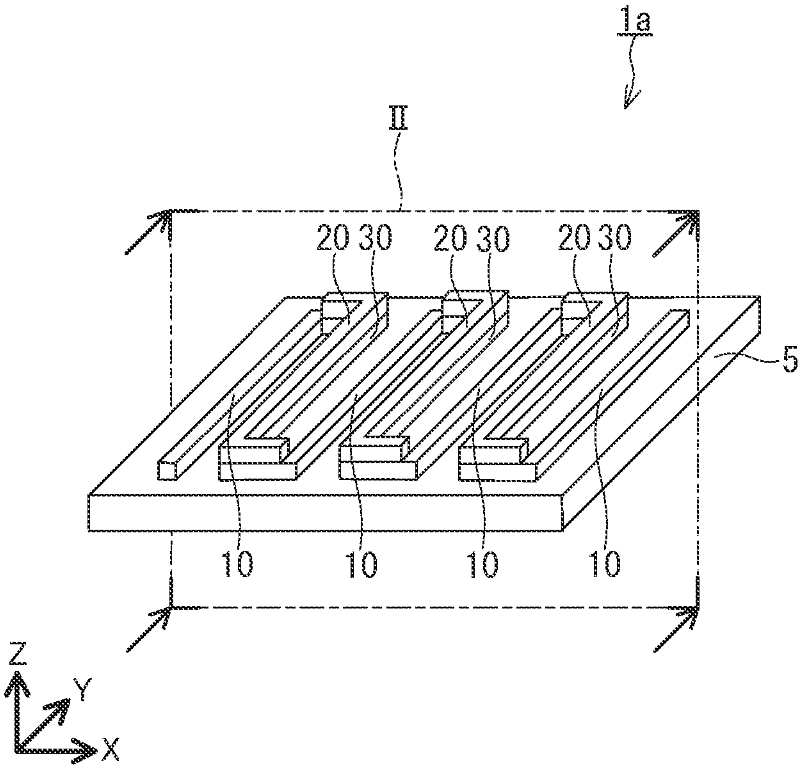
FIG. 1 is a perspective view showing an example of thermoelectric conversion element according to the present invention.
Figure 2:
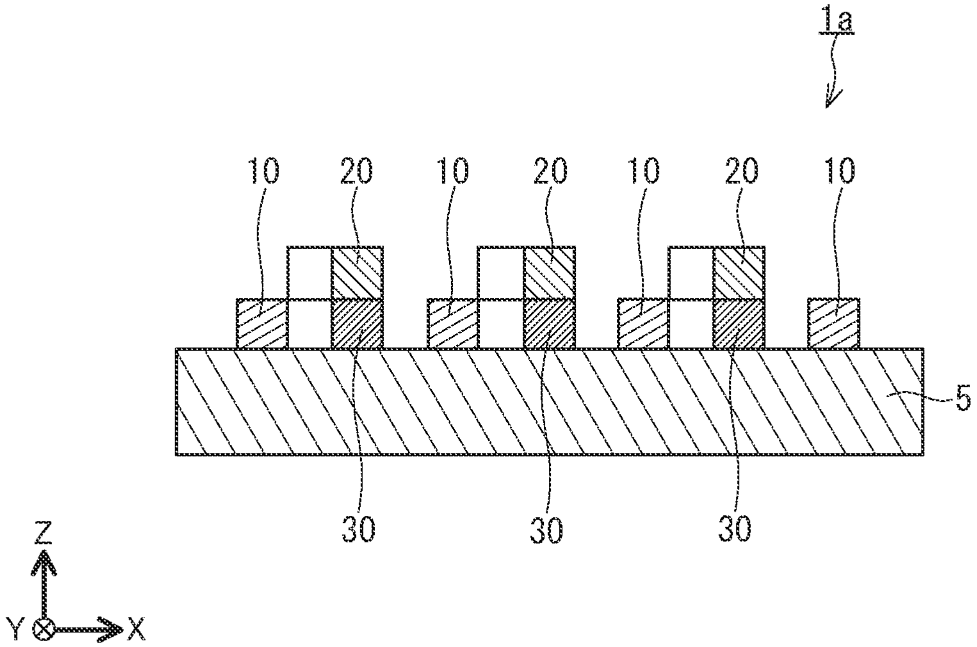
FIG. 2 is a cross-sectional view of the thermoelectric conversion element in FIG. 1, taken on a plane II as the cross section.

As shown in FIGS. 1 and 2, a thermoelectric conversion element 1*a* includes a thermoelectric conversion portion 10, a connection portion 20, and an extension portion 30. The thermoelectric conversion portion 10 includes an electroconductive magnetic body having ferromagnetism or antiferromagnetism and exhibiting an anomalous Nernst effect, and it linearly extends. The connection portion 20 includes an electroconductive body electrically connected to the thermoelectric conversion portion 10. The extension portion 30 is formed, for instance, of the electroconductive magnetic body extending from the thermoelectric conversion portion 10. In the thermoelectric conversion element 1*a*, for instance, the extension portion 30 and the connection portion 20 are layered.

Figure 6:
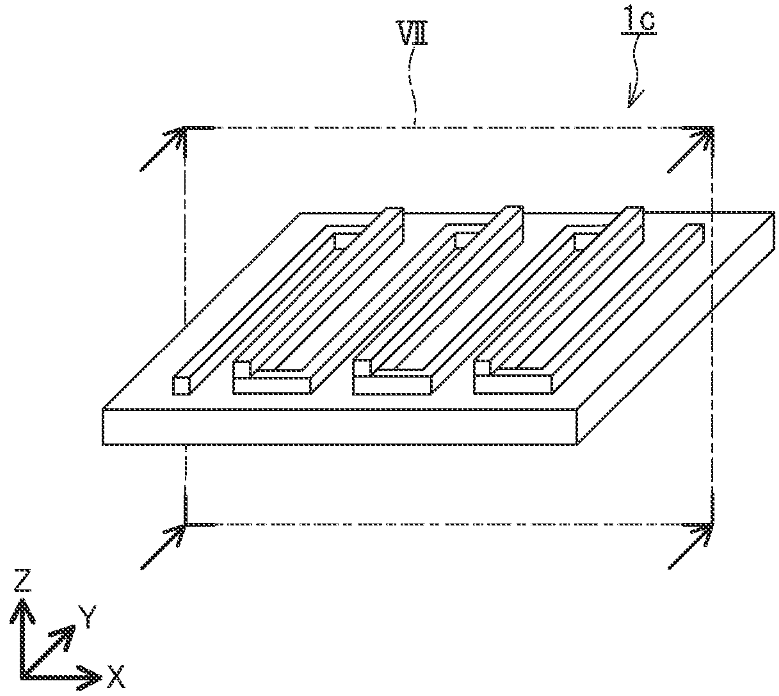
FIG. 6 is a perspective view showing still another example of thermoelectric conversion element according to the present invention.
Figure 7:
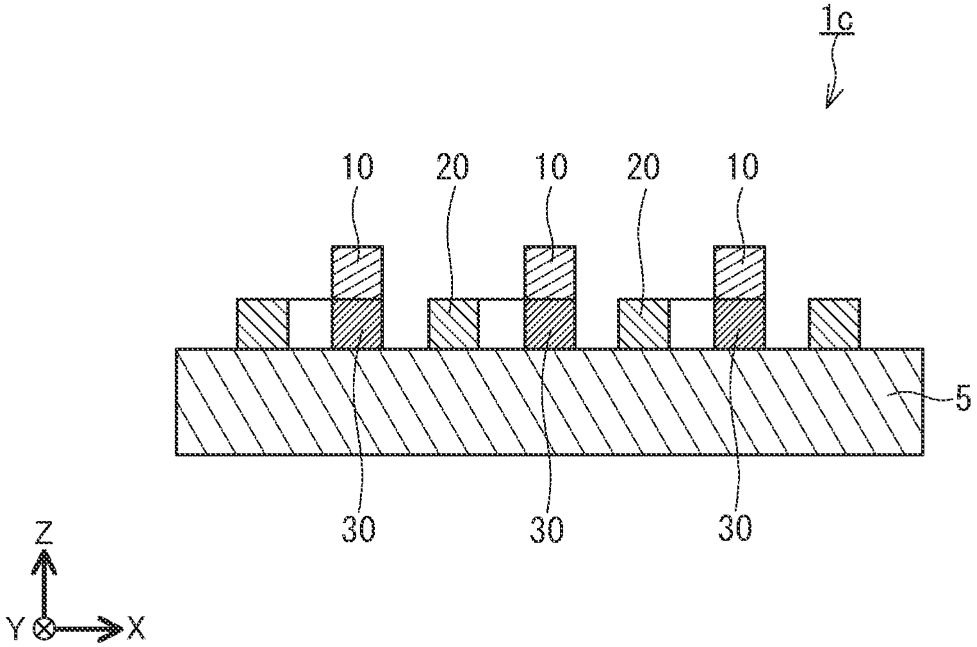
FIG. 7 is a cross-sectional view of the thermoelectric conversion element in FIG. 6, taken on a plane VII as the cross section.

The thermoelectric conversion element 1*a* may be configured as a thermoelectric conversion element 1*c* shown in FIG. 6 and FIG. 7. In the thermoelectric conversion element 1*c*, an extension portion 30 is formed of an electroconductive body extending from a connection portion 20. Further, the extension portion 30 and a thermoelectric conversion portion 10 are layered.

For instance, in the thermoelectric generation device of Patent Literature 1, the power generation body and the connection body are formed along the surface of the substrate, and thus, it is considered that the bottom surfaces of the power generation body and the connection body are formed at the same height. Therefore, it can be understood that the electrical connection between an end part of a thin wire of the power generation body and an end part of a thin wire of the connection body is for instance imparted to make a difference in height at a contact portion where the power generation body and the connection body are in contact with each other. Researches by the present inventors has newly clarified that cracks are likely to occur in the contact portion due to the difference in height. On the other hand, the connection portion 20 and the extension portion 30 formed of the electroconductive magnetic body extending from the thermoelectric conversion portion 10 are layered in the thermoelectric conversion element 1*a*. Further, the thermoelectric conversion portion 10 and the extension portion 30 formed of an electroconductive body extending from the connection portion 20 are layered in the thermoelectric conversion element 1*c*. This may prevent or reduce a difference in height at the contact portion for electrical connection between thermoelectric conversion portion 10 and connection portion 20. As a result, cracks are unlikely to occur in the contact portions of the thermoelectric conversion elements 1*a* and 1*c*.

In a case where the extension portion 30 is formed of an electroconductive magnetic body extending from the thermoelectric conversion portion 10 in the thermoelectric conversion element 1*a*, a greater electromotive force can be obtained as the value Rc obtained by dividing the specific resistance of the connection portion 20 by its thickness is smaller. Therefore, in comparison with the thermoelectric conversion element 1*c* where the extension portion 30 is formed of the electroconductive body extending from the connection portion 20, the resistance value of the thermoelectric conversion element 1*a* can be lowered and the noise can also be easily reduced, since the extension portion 30 in the thermoelectric conversion element 1*a* is formed of the electroconductive magnetic body extending from the thermoelectric conversion portion 10.

As shown in FIG. 1, the thermoelectric conversion element 1*a* includes a substrate 5, for instance. The substrate 5 has flexibility for instance, and thus, the thermoelectric conversion element 1*a* can be disposed along a curved surface. For instance, the substrate 5 has elasticity so that in a case where a strip-shaped specimen made of the substrate 5 is wound around a cylindrical mandrel with a diameter of 10 cm such that the both end parts in the length direction of the specimen are oriented to the same direction, the specimen is elastically deformable. As mentioned above, a difference in height is unlikely to occur in the contact portion for an electric connection between the thermoelectric conversion portion 10 and the connection portion 20, cracks are unlikely to occur even when the thermoelectric conversion element 1*a* is bent. Alternatively, the substrate 5 may be a non-flexible substrate like a glass substrate.

In a case where the substrate 5 has flexibility, the substrate 5 may include at least an organic polymer, for instance. As a result, the costs for manufacturing the thermoelectric conversion element 1*a* can be reduced easily. Examples of the organic polymer include polyethylene terephthalate (PET), polyethylene naphthalate (PEN), acrylic resin (PMMA), polycarbonate (PC), polyimide (PI), or cycloolefin polymer (COP). The substrate 5 may be an ultrathin glass sheet. An example of ultrathin glass sheet is G-Leaf (registered trademark) manufactured by Nippon Electric Glass Co., Ltd.

Visible transmittance of the substrate 5 is not limited to a specific value. The substrate 5 has a visible transmittance of 80% or more, for instance. This facilitates checking for foreign matters in manufacturing the thermoelectric conversion element 1*a*, and can prevent or reduce opening of the wiring in the thermoelectric conversion element 1*a*. The visible transmittance of the substrate 5 may be 83% or more, may be 86% or more, or may be 89% or more.

In the thermoelectric conversion element 1*a*, since the thermoelectric conversion portion 10 includes an electroconductive magnetic body having ferromagnetism or antiferromagnetism and exhibiting an anomalous Nernst effect, for instance, an electromotive force is generated in a direction orthogonal to a thickness direction (Z-axis direction) of the substrate 5 when a temperature gradient occurs in the thickness direction of the substrate 5.

The electroconductive magnetic body included in the thermoelectric conversion portion 10 is not limited to any specific substance, as long as the electroconductive magnetic body exhibits the anomalous Nernst effect. The substance exhibiting the anomalous Nernst effect is, for instance, a magnetic body having a saturation magnetic susceptibility of $5\times10^{-3}$ T or more, or a substance of a band structure with a Weyl point near the Fermi energy. The electroconductive magnetic body included in the thermoelectric conversion portion 10 contains, for instance, at least one substance selected from the group consisting of (i), (ii), (iii), (iv) and (v) below.

(i) A stoichiometric substance having a composition represented by $Fe_3X$ (ii) An off-stoichiometric substance having a composition ratio of Fe and X that deviates from that of the substance in (i) above (iii) A substance in which a part of the Fe site of the substance in (i) above or a part of the Fe site in the substance in (ii) above is substituted by a typical metal element or a transition element other than X (iv) A substance having a composition represented by $Fe_3M1_{1-x}M2_x$ (0<x<1), where M1 and M2 are typical elements different from each other (v) A substance in which a part of the Fe site of the substance in (i) above is substituted by a transition element other than X, and a part of the X site in the substance in (i) above is substituted by a typical metal element other than X In the substances (i) to (v), X is a typical element or a transition element. X is, for instance, Al, Ga, Ge, Sn, Si, Ti, Zr, Hf, V, Nb, Ta, Cr, Mo, W, Sc, Ni, Mn, or Co. In the above (iv), the combination of M1 and M2 is not limited to a specific combination as long as M1 and M2 are typical elements different from each other. In the above (iv), the combination of M1 and M2 is, for instance, Ga and Al, Si and Al, or Ga and B.

The electroconductive magnetic body included in the thermoelectric conversion portion 10 may contain $Co_2MnGa$. The electroconductive magnetic body contained in the thermoelectric conversion portion 10 may include an electroconductive antiferromagnetic body such as $Mn_3Sn$.

The thermoelectric conversion portion 10 has a specific resistance $\rho_t$ that may not be limited to a specific value. The specific resistance $\rho_t$ is, for instance, $1\times10^{-2}$ Ω·cm or less. This makes it easier to decrease the resistance value of the element and reduce noise. The specific resistance $\rho_t$ may be $1\times10^{-3}$ Ω·cm or less, may be $7\times10^{-4}$ Ω·cm or less, may be $3\times10^{-4}$ Ω·cm or less, or may be $2\times10^{-4}$ Ω·cm or less. The specific resistance $\rho_t$ may be, for instance, $1\times10^{-6}$ Ω·cm or more. Thereby, a desired electromotive force may be easily generated in the thermoelectric conversion portion 10. The specific resistance $\rho_t$ may be $1\times10^{-5}$ Ω·cm or more, and may be $1\times10^{-4}$ Ω·cm or more.

The electroconductive body included in the connection portion 20 is not limited to a specific substance. The electroconductive body may be a non-magnetic body, for instance. In this case, the electroconductive body includes a transition element with paramagnetism, for instance. Examples of the non-magnetic material include gold, copper, copper alloy, aluminum, and aluminum alloy. The connection body 22 may be a cured product of an electroconductive paste.

The relationship between a specific resistance $\rho_m$ of the extension portion 30, a thickness $t_m$ of the extension portion 30, a specific resistance $\rho_c$ of the connection portion 20, and a thickness $t_c$ of the connection portion 20, is not limited to a specific relationship. A value Rm and a value Rc satisfy Rc/Rm≤3, for instance, where the value Rm is obtained by dividing the specific resistance $\rho_m$ of the extension portion 30 by its thickness $t_m$, and the value Rc is obtained by dividing the specific resistance $\rho_c$ of the connection portion 20 by its thickness to. This makes it easier for the thermoelectric conversion element 1*a* to exhibit the desired thermoelectric conversion performance, because the current in the connection portion 20 tends to be larger than in the extension portion 30 including the electroconductive magnetic body, and this may facilitate decreasing the influence of the thermoelectromotive force in the extension portion 30 with respect to the current in the layered body of the extension portion 30 and the connection portion 20. The Rc/Rm may be 2.5 or less, may be 2.3 or less, may be 2.0 or less, may be 1.8 or less, may be 1.5 or less, may be 1.2 or less, or may be 1.0 or less. The Rc/Rm is, for instance, 0.01 or more, may be 0.02 or more, or may be 0.05 or more.

The value Rc is, for instance, 100Ω or less. This makes it easier to reduce the resistance value of the element and reduce noise. The value Rc may be 90Ω or less, may be 80Ω or less, may be 70Ω or less, may be 60Ω or less, may be 50Ω or less, may be 40Ω or less, may be 30Ω or less, may be 20Ω or less, may be 15Ω or less, or may be 10Ω or less. The value Rc is, for instance, 0.1Ω or more.

The extension portion 30 has a specific resistance $\rho_m$ in a range of $1\times10^{-6}$ to $1\times10^{-2}$ Ω·cm, for instance. This makes it easier to satisfy the requirement of Rc/Rm≤3. The specific resistance $\rho_m$ may be $1\times10^{-5}$ Ω·cm or more, or may be $1\times10^{-4}$ Ω·cm or more. The specific resistance $\rho_m$ may be $5\times10^{-3}$ Ω·cm or less, or may be $1\times10^{-3}$ Ω·cm or less.

The extension portion 30 has a thickness $t_m$ in a range of 5 to 1000 nm for instance. This makes it easier to satisfy the requirement of Rc/Rm≤3. The thickness $t_m$ may be 20 nm or more, may be 30 nm or more, may be 50 nm or more, or may be 70 nm or more. The thickness $t_m$ may be 500 nm or less, may be 400 nm or less, may be 300 nm or less, or may be 200 nm or less.

The connection portion 20 has a specific resistance pc of less than $1\times10^{-3}$ Ω·cm, for instance. This makes it easier to satisfy the requirement of Rc/Rm≤3. The specific resistance $\rho_c$ may be $5\times10^{-4}$ Ω·cm or less, may be $4\times10^{-4}$ Ω·cm or less, may be $3\times10^{-4}$ Ω·cm or less, may be $2\times10^{-4}$ Ω·cm, or May $1\times10^{-4}$ Ω·cm or less. The specific resistance pc may be, for instance $5\times10^{-6}$ Ω·cm or more, may be $1\times10^{-5}$ Ω·cm or less more, or may be $1.5\times10^{-5}$ Ω·cm or more The connection portion 30 has a thickness $t_c$ in a range of 5 to 1000 nm for instance. This makes it easier to satisfy the requirement of Rc/Rm≤3. The thickness $t_c$ may be 10 nm or more, may be 20 nm or more, may be 30 nm or more, may be 40 nm or more, or may be 50 nm or more. The thickness $t_c$ may be 500 nm or less, may be 400 nm or less, may be 300 nm or less, or may be 200 nm or less.

As shown in FIGS. 1 and 2, the thermoelectric conversion element 1*a* includes a plurality of thermoelectric conversion portions 10, for instance. The thermoelectric conversion portions 10 are disposed spaced apart at predetermined intervals in the X-axis direction and parallel to each other, for instance. The thermoelectric conversion portions 10 extend linearly in the Y-axis direction, for instance. For instance, the thermoelectric conversion portions 10 are disposed at equal intervals in the X-axis direction. Electroconductive magnetic bodies included in the thermoelectric conversion portions 10 are magnetized in the same direction. For instance, the electroconductive magnetic bodies are magnetized in the width direction of the thermoelectric conversion portions 10 (X-axis positive direction or X-axis negative direction).

As shown in FIG. 1, the thermoelectric conversion portions 10 and the extension portions 30 are formed continuously. For instance, the thermoelectric conversion portions 10 form a meander pattern together with the extension portions 30. Since the extension portions 30 and the connection portions 20 are layered, the thermoelectric conversion portions 10 in the meander pattern are electrically connected in series, and the electromotive force generated in thermoelectric conversion element 1*a* tends to increase. For instance, by connecting wirings to both ends of the meander pattern, the electromotive force generated in thermoelectric conversion element 1*a* can be taken out to the outside.

An extension portion 30 extends between the end parts of thermoelectric conversion portions 10 adjacent to each other, for instance. The extension portion 30 extends, for instance, between an end part in the length direction of a thermoelectric conversion portion 10 and an end part in the length direction of another thermoelectric conversion portion 10 adjacent to the first-described thermoelectric conversion portion 10. The end parts of the thermoelectric conversion portions 10 adjacent to each other and connected to the extension portion 30 are positioned oppositely each other in the Y-axis direction. The thermoelectric conversion element 1*a* has a plurality of extension portions 30, for instance. The extension portions 30 are disposed spaced apart from each other at predetermined intervals in the X-axis direction and parallel to each other. Each of the extension portions 30 has, for instance, a part that extends linearly in the Y-axis direction, and a part that extends in the X-axis direction at the end part of each extension portion 30 in the Y-axis direction.

As shown in FIG. 2, the extension portions 30 are disposed, for instance, between the substrate 5 and the connection portions 20 in the thickness direction of the substrate 5. For instance, the extension portions 30 are in contact with the connection portions 20 in the thickness direction of the substrate 5. The thermoelectric conversion element 1*a* includes a plurality of connection portions 20, for instance. The connection portions 20 are disposed spaced apart at predetermined intervals in the X-axis direction and parallel to each other. Each of the connection portions 20 has, for instance, a part that extends linearly in the Y-axis direction, and a part that extends in the X-axis direction at the end part of each connection portion 20 in the Y-axis direction. For instance, the end parts of the connection portions 20 form contact portions for electrical connection between thermoelectric conversion portions 10 and connection portions 20.

Figure 3A:
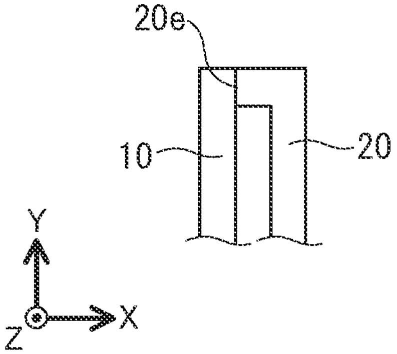
FIG. 3A is a plan view showing an example of state of an end part of the connection portion.

As shown in FIG. 3A, in a plan view of the thermoelectric conversion element 1*a*, a boundary 20*e* extends, for instance, in the length direction (Y-axis direction) of the thermoelectric conversion portion 10. The boundary 20*e* corresponds to a boundary between either the thermoelectric conversion portion 10 or the extension portion 30 overlapping with the connection portion 20 in the vicinity of the end part in the length direction of the thermoelectric conversion portion 10 and either the thermoelectric conversion portion 10 or the extension portion 30 not overlapping with the connection portion 20. If the boundary 20*e* is formed in this way, cracks are less likely to occur when stress is generated in the Y-axis direction.

Figure 3B:
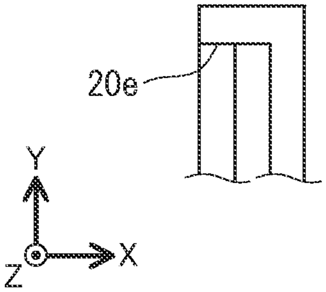
FIG. 3B is a plan view showing another example of state of an end part of the connection portion.

As shown in FIG. 3B, in a plan view of the thermoelectric conversion element 1*a*, the boundary 20*e* may extend in the width direction (X-axis direction) of the thermoelectric conversion portion 10. In this case, cracks are less likely to occur when stress is generated in the X-axis direction.

In a plan view of the thermoelectric conversion element 1*a*, the boundary 20*e* may be inclined with respect to the X axis and the Y axis. In this case, cracks are less likely to occur when stress is generated in the direction extending along the boundary 20*e*.

A width as the dimension in the X-axis direction of the thermoelectric conversion portion 10 is not limited to a specific value. The width of each thermoelectric conversion portion 10 is, for instance, 500 μm or less. Thereby, use amount of the material for forming the thermoelectric conversion portion 10 in the thermoelectric conversion element 1*a* can be decreased, and the costs for manufacturing the thermoelectric conversion element 1*a* can be reduced easily.

In addition to that, numbers of thermoelectric conversion portions 10 can be disposed easily in the X-axis direction, whereby the electromotive force generated in the thermoelectric conversion element 1*a* tends to increase.

The width of the thermoelectric conversion portion 10 may be 400 μm or less, may be 300 μm or less, or may be 200 μm or less. The width of the thermoelectric conversion portion 10 is, for instance, 0.1 μm or more. Thereby, disconnection of the thermoelectric conversion portion 10 is less likely to occur, and the thermoelectric conversion element 1*a* can easily exhibit high durability. The width of each thermoelectric conversion portion 10 may be 0.5 μm or more, may be 1 μm or more, may be 2 μm or more, may be 5 μm or more, may be 10 μm or more, may be 20 μm or more, or may be 50 μm or more.

The width of the connection portion 20 and the extension portion 30, which is the minimum dimension in the X-axis direction, is not limited to a specific value. The width of the connection portion 20 and the extension portion 30 is 500 μm or less, for instance. Thereby, use amount of the material for forming the connection body 22 in the thermoelectric conversion element 1*a* can be decreased, and the costs for manufacturing the thermoelectric conversion element 1*a* can be reduced easily. In addition to that, numbers of thermoelectric conversion portions 10 can be disposed easily in the X-axis direction, whereby the electromotive force generated in the thermoelectric conversion element 1*a* tends to increase.

The width of the connection portion 20 and the extension portion 30 may be 400 μm or less, may be 300 μm or less, may be 200 μm or less, may be 100 μm or less, or may be 50 μm or less. The width of the connection portion 20 and the extension portion 30 is, for instance, 0.1 μm or more. Thereby, disconnection of the connection portion 20 and the extension portion 30 in the thermoelectric conversion element 1*a* is less likely to occur, and the thermoelectric conversion element 1*a* can easily exhibit high durability. The width of the connection portion 20 and the extension portion 30 may be 0.5 μm or more, may be 1 μm or more, may be 2 μm or more, may be 5 μm or more, may be 10 μm or more, may be 20 μm or more, or may be 30 μm or more.

Figure 4:
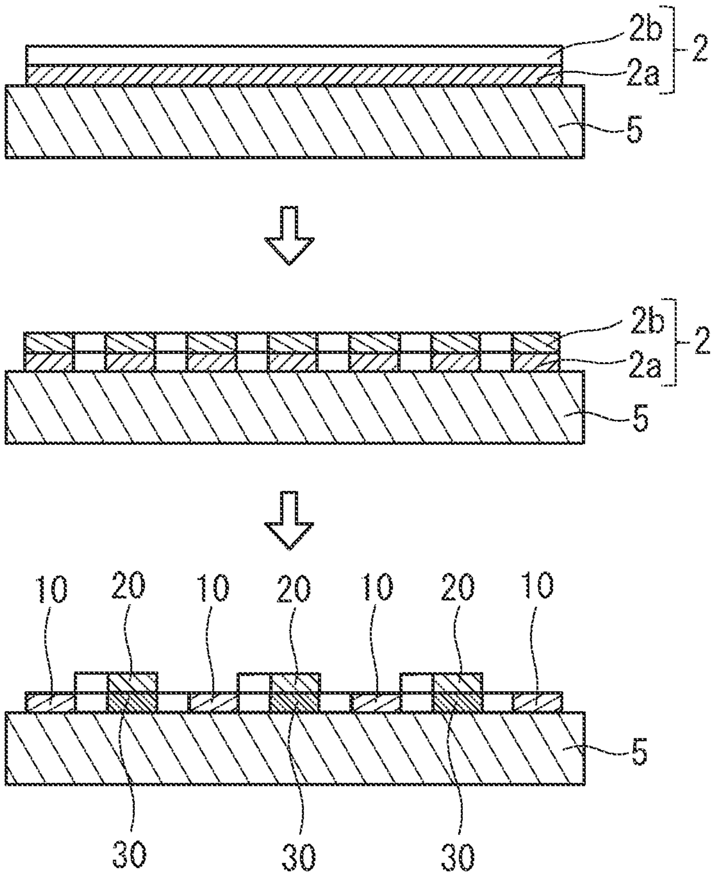
FIG. 4 is a cross-sectional view showing an example of method for manufacturing a thermoelectric conversion element according to the present invention.

An example of the method for manufacturing the thermoelectric conversion element 1*a* will be explained. As shown in FIG. 4, the thermoelectric conversion element 1*a* is manufactured by a method including formation of thermoelectric conversion portions 10, connection portions 20 and extension portions 30, by etching a layered body 2 including a first layer 2*a* and a second layer 2*b*, for instance. The first layer 2*a* includes an electroconductive magnetic body having ferromagnetism or antiferromagnetism and exhibiting an anomalous Nernst effect. The second layer 2*b* includes an electroconductive body. In this method, the thermoelectric conversion portions 10, the connection portions 20, and the extension portions 30 are formed such that the connection portions 20 and the extension portions 30 are layered. According to this method, the thermoelectric conversion element 1*a* can be manufactured easily and efficiently, and this method is advantageous from the viewpoint of mass production.

The aforementioned method may include, for instance, formation of the first layer 2*a* and the second layer 2*b* successively in a state isolated from the atmosphere. In this case, the layered body 2 is formed without the interface between first layer 2*a* and second layer 2*b* being affected by the atmosphere, and thus, the contact portions for electrical connection between the thermoelectric conversion portions 10 and the connection portions 20 tend to have high durability.

The method of forming the first layer 2*a* and the second layer 2*b* is not limited to a specific method. The first layer 2*a* and the second layer 2*b* are formed by magnetron sputtering, for instance. In this case, the first layer 2*a* and the second layer 2*b* are less likely to separate, and cracks are less likely to occur at the contact portion for electrical connection between the thermoelectric conversion portions 10 and the connection portions 20. The first layer 2*a* and the second layer 2*b* each may be formed by any other method such as sputtering, chemical vapor deposition (CVD), pulsed laser deposition (PLD), ion plating, or plating.

This method will be explained in more detail. The first layer 2*a* is formed on one principal surface of the substrate 5 by magnetron sputtering, and the second layer 2*b* is successively formed on the first layer 2*a* by magnetron sputtering. In this way, a layered body 2 is formed on one principal surface of the substrate 5. Next, a photoresist is applied onto the layered body 2, a photomask is disposed above the layered body 2 and exposed, followed by wet etching. In this way, the first layer 2*a* and the second layer 2*b* are patterned so that they have the same shape in a plan view. For instance, the first layer 2*a* and the second layer 2*b* are etched to have a meander pattern. After that, a part of the second layer 2*b* is further etched selectively, so that a part of the first layer 2*a* becomes visible in the plan view. Next, the electroconductive magnetic body included in the first layer 2*a* is magnetized in a predetermined direction. As a result, the thermoelectric conversion element 1*a* is obtained.

Figure 5:
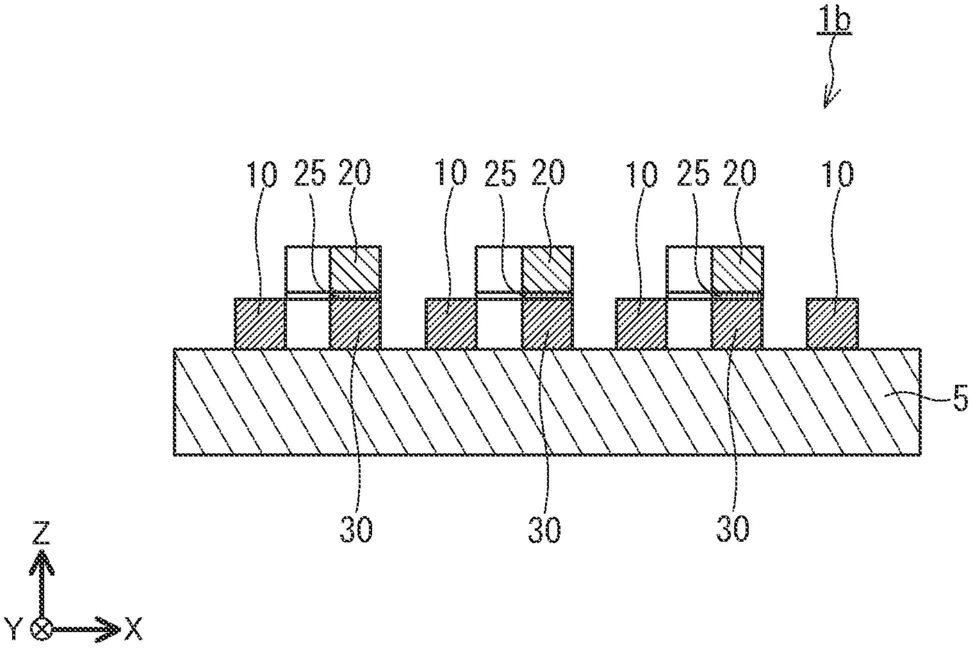
FIG. 5 is a cross-sectional view showing another example of thermoelectric conversion element according to the present invention.

The thermoelectric conversion element 1*a* can be modified from various viewpoints. For instance, the thermoelectric conversion element 1*a* may be modified to a thermoelectric conversion element 1*b* as shown in FIG. 5 or a thermoelectric conversion element 1*c* as shown in FIG. 6 and FIG. 7. The thermoelectric conversion element 1*b* and the thermoelectric conversion element 1*c* have the same structure as the thermoelectric conversion element 1*a*, except for the parts that are specifically explained. Components that are the same as or correspond to those of the thermoelectric conversion element 1*a* are given the same reference numerals, and detailed explanations therefor are omitted. The explanations regarding the thermoelectric conversion element 1*a* also apply to the thermoelectric conversion element 1*b* and the thermoelectric conversion element 1*c*, unless technically contradictory.

As shown in FIG. 5, the thermoelectric conversion element 1*b* further includes an intermediate layer 25. The intermediate layer 25 is disposed between the connection portion 20 and the extension portion 30. For instance, due to the intermediate layer 25, the connection portion 20 and the extension portion 30 becomes difficult to separate from each other. The intermediate layer 25 has electrical conductivity for instance. Alternatively, the intermediate layer 25 may be non-conductive as long as the thermoelectric conversion portion 10 and the connection portion 20 are electrically connectable to each other.

A thermoelectric conversion element 1*c* has a plurality of connection portions 20, for instance. The connection portions 20 are disposed spaced apart at predetermined intervals in the X-axis direction and parallel to each other, for instance. Each of the connection portions 20 has a part that extends linearly in the Y-axis direction, and a part that extends in the X-axis direction at the end part of each connection portion 20 in the Y-axis direction.

As shown in FIG. 6 and FIG. 7, the connection portions 20 and the extension portions 30 are formed continuously. For instance, the connection portions 20 form a meander pattern together with the extension portions 30. Since the extension portions 30 and the thermoelectric conversion portions 10 are layered, a plurality of thermoelectric conversion portions 10 are electrically connected in series, whereby the electromotive force generated in thermoelectric conversion element 1*a* tends to increase.

An extension portion 30 extends, for instance, between the end parts of connection portions 20 adjacent to each other. For instance, the extension portion 30 extends between an end in the length direction of a connection portion 20 and an end part in the length direction of another connection portion 20 adjacent to the first-described connection portion 20. The end parts of the adjacent connection portions 20 connected to the extension portion 30 are positioned oppositely each other in the Y-axis direction.

As shown in FIG. 7, the extension portion 30 is positioned, for instance, between the substrate 5 and the thermoelectric conversion portion 10 in the thickness direction of the substrate 5. The extension portion 30 is in contact with the thermoelectric conversion portion 10 in the thickness direction of the substrate 5, for instance.

The thermoelectric conversion elements 1*a*, 1*b*, and 1*c* each can be provided with a pressure-sensitive adhesive layer, for instance. In this case, the substrate 5 is disposed between the thermoelectric conversion portion 10 and the pressure-sensitive adhesive layer in the thickness direction of the substrate 5. Thereby, it is possible to attach the thermoelectric conversion element 1*a*, 1*b* or 1*c* to an article by pressing the pressure-sensitive adhesive layer onto the article.

The pressure-sensitive adhesive layer includes, for instance, a rubber-based pressure-sensitive adhesive, an acrylic pressure-sensitive adhesive, a silicone-based pressure-sensitive adhesive, or a urethane-based pressure-sensitive adhesive. The thermoelectric conversion element 1*a* may be provided together with a pressure-sensitive adhesive layer and a release liner. In this case, the release liner covers the pressure-sensitive adhesive layer. Typically, the release liner is a film that can maintain the adhesiveness of the pressure-sensitive adhesive layer while covering the layer, and it can be peeled off easily from the pressure-sensitive adhesive layer. The release liner is, for instance, a film made of a polyester resin like PET. By peeling the release liner off, the pressure-sensitive adhesive layer is exposed and the thermoelectric conversion element 1*a* can be adhered to an article.

EXAMPLES

Hereinafter, the present invention will be described in detail by referring to Examples. It should be noted that the present invention is not limited to the following Examples. First, evaluation methods regarding Examples and Comparative Examples will be explained.

[Crack Resistance Evaluation]

A strip-shaped specimen was prepared from a sample according to each Example and each Comparative Example. The specimen was wrapped around a horizontally-fixed cylindrical mandrel having a diameter of 5 mm, and a 100 g weight was attached to the both ends of the specimen, thereby applying a load to the specimen. More specifically, the specimen was wrapped around the mandrel so that the FeGa linear pattern straddled the mandrel along the length direction of the FeGa linear pattern. Afterwards, it was determined that a crack occurred between the FeGa linear pattern and the Cu thin wire when the electrical resistance value of the electroconductive path formed of the FeGa linear pattern and the Cu thin wire became 1.5 times or more of the initial value. The results are shown in Table 1. In Table 1, "A" means that no crack occurrence was confirmed, and "X" means that crack occurrence was confirmed.

[Evaluation of Thermoelectric Conversion Performance]

The sample according to each Example and each Comparative Example was fixed between a pair of Cu plates with dimensions of 30 mm, 30 mm, and 5 mm, using silicone grease KS609 manufactured by Shin-Etsu Chemical Co., Ltd., thereby producing a sample for thermoelectric property evaluation. This sample was disposed on a cool plate SCP-125 supplied by AS ONE Corporation. A film heater manufactured by Shinwa Rules Co., Ltd. was fixed on the upper Cu plate with a double-sided tape No. 5000NS manufactured by Nitto Denko Corporation. This heater had dimensions of 30 mm square and an electrical resistance value of 20Ω. While the temperature of the cool plate was maintained at 25° C., the film heater was made generate heat under a constant voltage control of 10 V, and the amount of heat output from the film heater was adjusted to 0.52 W/cm$^2$. At this time, the electromotive force generated in each sample was measured using a data logger. The results are shown in Table 1.

[Specific Resistance and Thickness]

Sheet resistances of the FeGa layer and the Cu layer were measured in each Example and each Comparative Example by the eddy current method using a non-contact type resistance measuring instrument NC-80LINE manufactured by NAPSON CORPORATION in accordance with Japanese Industrial Standard (JIS) Z 2316.

Samples of FeGa and Cu for cross-sectional observation were prepared as the samples according to each Example and each Comparative Example, using a focused ion beam system FB-2000A manufactured by Hitachi High-Technologies. A field emission transmission electron microscope HF-2000 manufactured by Hitachi High-Technologies was used to observe the sample for cross-sectional observation, whereby thicknesses of a site containing FeGa of a sample according to each Example and Each Comparative Example and a site containing Cu of a sample according to each Example and each Comparative Example were measured. This thickness was regarded as the thickness of each site of sample in each Example and each Comparative Example. The results are shown on Table 1. Based on the sheet resistance of the FeGa layer and the Cu layer and also the thickness of the thermoelectric conversion portion and the connection portion of a sample according to each Example and each Comparative Example, the specific resistance of each site of a sample in each Example and each Comparative Example was determined. The results are shown in Table 1.

Example 1

An FeGa layer having a thickness of 100 nm was formed on a polyethylene terephthalate (PET) film having a thickness of 50 μm by DC magnetron sputtering using a target material containing Fe and Ga. The PET film had a visible transmittance of 80% or more. In the target material, the atomic ratio of the Fe content to the Ga content was in a relationship of 3:1. After that, a Cu layer with a thickness of 100 nm was continuously formed on the FeGa layer by DC magnetron sputtering using a Cu target material while being isolated from the atmosphere, whereby a layered body including the FeGa layer and the Cu layer was formed. Next, a photoresist was applied onto the layered body, a photomask was disposed above the layered body and exposed, followed by wet etching. As a result, a meander pattern of a layered body of FeGa and Cu was formed. The thus formed meander pattern had a structure in which thin wires with a length of 15 mm and a width of 100 μm and thin wires with a length of 15 mm and a width of 40 μm were disposed alternately at intervals of 10 μm. Next, a photoresist was applied onto the meander pattern of the layered body, a photomask was disposed above the layered body and exposed, followed by wet etching to selectively remove Cu on the thin wires with a width of 100 μm, thereby obtaining 98 thermoelectric conversion portions where only the electroconductive magnetic body FeGa remained. In this way, a meander pattern of the thermoelectric conversion portions having a width of 100 μm and layered structures having a width of 40 μm of an electroconductive magnetic body FeGa and an electroconductive body Cu was obtained, where the thermoelectric conversion portions and the layered structures were parallel to each other and spaced apart from each other in a plan view. In this layered body structure, the electroconductive magnetic body FeGa formed the extension portions, and the electroconductive body Cu constituted the connection portions. Using an electromagnet with a central magnetic flux density of 0.5 T, an FeGa linear pattern was magnetized in a direction parallel to the plane of the PET film and orthogonal to the length direction of the magnetic thermoelectric conversion portion, thereby obtaining a sample according to Example 1. In a plan view of the sample according to Example 1, the boundary between a part of the FeGa linear pattern overlapping with the Cu thin line and the part of the FeGa linear pattern not overlapping with the Cu thin line was formed parallel to the length direction of the FeGa linear pattern. The sample according to Example 1 generated an electromotive force based on the anomalous Nernst effect.

Example 2

A sample according to Example 2 was manufactured in the same manner as in Example 1, except that the requirements for the DC magnetron sputtering using a Cu target material were adjusted so that the Cu layer had a thickness of 23 nm.

Example 3

A sample according to Example 3 was manufactured in the same manner as in Example 1, except that the requirements for the DC magnetron sputtering using a Cu target material were adjusted so that the Cu layer had a thickness of 14 nm.

Example 4

A sample according to Example 4 was manufactured in the same manner as in Example 1, except that the requirements for the DC magnetron sputtering using a Cu target material were adjusted so that the Cu layer had a thickness of 11 nm.

Example 5

A sample according to Example 5 was manufactured in the same manner as in Example 1, except that the requirements for the DC magnetron sputtering using a Cu target material were adjusted so that the Cu layer had a thickness of 5 nm.

Example 6

A sample according to Example 6 was manufactured in the same manner as in Example 1, except that the requirements for the DC magnetron sputtering using a target material containing Fe and Ga were adjusted so that the FeGa layer had a thickness of 200 nm, and the requirements for the DC magnetron sputtering using a Cu target material were adjusted so that the Cu layer had a thickness of 15 nm.

Example 7

A sample according to Example 7 was manufactured in the same manner as in Example 1, except that the requirements for the DC magnetron sputtering using a target material containing Fe and Ga were adjusted so that the FeGa layer had a thickness of 250 nm, and the requirements for the DC magnetron sputtering using a Cu target material were adjusted so that the Cu layer had a thickness of 10 nm.

Example 8

A sample according to Example 8 was manufactured in the same manner as in Example 1, except that the requirements for the DC magnetron sputtering using a target material containing Fe and Ga were adjusted so that the FeGa layer had a thickness of 250 nm and that the requirements for the DC magnetron sputtering using a Cu target material were adjusted so that the Cu layer had a thickness of 8 nm.

Comparative Example 1

A thin film having a thickness of 100 nm was formed on a polyethylene terephthalate (PET) film having a thickness of 50 μm by DC magnetron sputtering using a target material containing Fe and Ga. The PET film had a visible transmittance of 80% or more. In the target material, the atomic ratio of the Fe content to the Ga content was in a relationship of 3:1. A photoresist was applied onto the FeGa layer, a photomask was disposed above the FeGa layer and exposed, followed by wet etching. As a result, 98 FeGa linear patterns disposed parallel to each other at predetermined intervals were formed. The width of each FeGa linear pattern was 100 μm, and the length of each FeGa linear pattern was 15 mm. After that, a Cu thin film having a thickness of 100 nm was formed by DC magnetron sputtering using a Cu-containing target material. A photoresist was applied onto the Cu layer, a photomask was disposed above the Cu thin film and exposed, followed by wet etching. In this manner, a Cu linear pattern having a width of 40 μm was formed. A pair of FeGa linear patterns adjacent to each other were electrically connected by the Cu linear pattern, thereby forming an electroconductive path of a meander pattern. Using an electromagnet with a central magnetic flux density of 0.5 T, the FeGa linear pattern was magnetized in a direction parallel to the plane of the PET film and orthogonal to the length direction of the FeGa linear pattern, whereby a sample according to Comparative Example 1 was obtained. This sample generated an electromotive force based on the anomalous Nernst effect.

Comparative Example 2

A sample according to Comparative Example 2 was manufactured in the same manner as in Example 1, except that the requirements for the DC magnetron sputtering were adjusted so that the FeGa layer had a thickness of 250 nm and that the Cu layer had a thickness of 5 nm.

As shown in Table 1, an electromotive force of 0.11 mV or more was obtained in a sample according to each Example, and it is understood that the sample according to each Example was applicable as a thermoelectric conversion element. In addition, in the sample according to each Example, no cracks were likely to occur between the FeGa-containing linear pattern and the Cu thin wire even in a case where a predetermined bending load was applied. In the sample according to Comparative Example 1, a high thermoelectromotive force was obtained. However, it was confirmed that a crack occurred between the FeGa-containing linear pattern and the Cu-containing linear pattern when a predetermined bending load was applied. In the sample according to Comparative Example 2, no cracks occurred between the FeGa-containing linear pattern and the Cu thin wire even when a predetermined bending load was applied. However, the generated electromotive force was less than 0.10 mV, and thus, it was difficult to use the sample as a thermoelectric conversion element.

A first aspect of the present invention provides a thermoelectric conversion element including:

a thermoelectric conversion portion including an electroconductive magnetic body and extending linearly, the electroconductive magnetic body having ferromagnetism or antiferromagnetism and capable of exhibiting an anomalous Nernst effect;

a connection portion including an electroconductive body and electrically connected to the thermoelectric conversion portion; and an extension portion formed of the electroconductive magnetic body extending from the thermoelectric conversion portion, or formed of the electroconductive body extending from the connection portion, wherein the extension portion formed of the electroconductive magnetic body extending from the thermoelectric conversion portion and the connection portion are layered, or the extension portion formed of the electroconductive body extending from the connection portion and the thermoelectric conversion portion are layered.

A second aspect of the present invention provides the thermoelectric conversion element according to the first aspect, wherein the thermoelectric conversion portion has a specific resistance of $1\times10^{-2}$ Ω·cm or less.

A third aspect of the present invention provides the thermoelectric conversion element according to the first or second aspect, wherein the extension portion is formed of the electroconductive magnetic body extending from the thermoelectric conversion portion, and the extension portion and the connection portion are layered.

A fourth aspect of the present invention provides the thermoelectric conversion element according to the third aspect, wherein where a value Rm is obtained by dividing a specific resistance of the extension portion by a thickness of the extension portion, and a value Rc is obtained by dividing a specific resistance of the connection portion by a thickness of the connection portion, Rm and Rc satisfy $Rc/Rm \leq 3$.

A fifth aspect of the present invention provides the thermoelectric conversion element according to any one of the first to fourth aspects, wherein a value Rc obtained by dividing a specific resistance of the connection portion by a thickness of the connection portion is 100Ω or less.

A sixth aspect of the present invention provides the thermoelectric conversion element according to any one of the first to fifth aspects, wherein the connection portion has a specific resistance of $1\times10^{-3}$ Ω·cm or less.

A seventh aspect of the present invention provides the thermoelectric conversion element according to any one of the first to sixth aspects, wherein the thermoelectric conversion portion or the connection portion forms a meander pattern together with the extension portion.

An eighth aspect of the present invention provides the thermoelectric conversion element according to any one of the first to seventh aspects, including a flexible substrate, wherein the thermoelectric conversion portion, the connection portion, and the extension portion are disposed on the substrate.

A ninth aspect of the present invention provides a method for manufacturing a thermoelectric conversion element, the method including:

forming a thermoelectric conversion portion, a connection portion, and an extension portion by etching a layered body including a first layer and a second layer, the first layer including an electroconductive magnetic body having ferromagnetism or antiferromagnetism and capable of exhibiting an anomalous Nernst effect, and the second layer including an electroconductive body, the thermoelectric conversion portion including the electroconductive magnetic body and linearly extending;

the connection portion including the electroconductive body and being electrically connected to the thermoelectric conversion portion; and the extension portion being formed of the electroconductive magnetic body extending from the thermoelectric conversion portion or formed of the electroconductive body extending from the connection portion, wherein the thermoelectric conversion portion, the connection portion, and the extension portion are formed so that the extension portion formed of the electroconductive magnetic body extending from the thermoelectric conversion portion and the connection portion are layered, or that the extension portion formed of the electroconductive body extending from the connection portion and the thermoelectric conversion portion are layered.

A tenth aspect of the present invention provides the method according to the ninth aspect, including successively forming the first layer and the second layer in a state isolated from the atmosphere.

An eleventh aspect of the present invention provides the method according to the tenth aspect, wherein the first layer and the second layer are formed by magnetron sputtering.

TABLE 1

| | Thermoelectric conversion portion and extension portion | | | |
|---|---|---|---|---|
| | Material | Specific resistance [μΩ · cm] | Thickness [nm] | Specific resistance/thickness $R_m$ [Ω] |
| Example 1 | Fe3Ga | 100 | 100 | 10 |
| Example 2 | Fe3Ga | 100 | 100 | 10 |
| Example 3 | Fe3Ga | 100 | 100 | 10 |
| Example 4 | Fe3Ga | 100 | 100 | 10 |
| Example 5 | Fe3Ga | 100 | 100 | 10 |
| Example 6 | Fe3Ga | 100 | 200 | 5 |
| Example 7 | Fe3Ga | 100 | 250 | 4 |
| Example 8 | Fe3Ga | 100 | 250 | 4 |
| Comparative Example 1 | Fe3Ga | 100 | 100 | 10 |
| Comparative Example 2 | Fe3Ga | 100 | 250 | 4 |

TABLE 1

| | Connection portion | | | | | Evaluation | |
|---|---|---|---|---|---|---|---|
| | Material | Specific resistance [μΩ · cm] | Thickness [nm] | Specific resistance/ thickness [Ω] | Rc/Rm | Electro-motive force [mV] | Crack resistance |
| Example 1 | Cu | 6.9 | 100 | 0.69 | 0.07 | 1.13 | A |
| Example 2 | Cu | 6.9 | 23 | 2.967 | 0.30 | 0.78 | A |
| Example 3 | Cu | 6.9 | 14 | 4.8 | 0.48 | 0.66 | A |
| Example 4 | Cu | 6.9 | 11 | 6.3 | 0.63 | 0.72 | A |
| Example 5 | Cu | 6.9 | 5 | 13.8 | 1.38 | 0.19 | A |
| Example 6 | Cu | 6.9 | 15 | 4.6 | 0.92 | 0.46 | A |
| Example 7 | Cu | 6.9 | 10 | 6.9 | 1.73 | 0.15 | A |
| Example 8 | Cu | 6.9 | 8 | 8.6 | 2.16 | 0.11 | A |
| Comparative Example 1 | Cu | 6.9 | 100 | 0.69 | 0.07 | 1.37 | X |
| Comparative Example 2 | Cu | 6.9 | 5 | 13.8 | 3.45 | 0.09 | A |

The invention claimed is:

1. A thermoelectric conversion element comprising:

a thermoelectric conversion portion comprising an electroconductive magnetic body and extending linearly, the electroconductive magnetic body having ferromagnetism or antiferromagnetism and capable of exhibiting an anomalous Nernst effect;

a connection portion comprising an electroconductive body and electrically connected to the thermoelectric conversion portion; and an extension portion formed of the electroconductive magnetic body extending from the thermoelectric conversion portion, or formed of the electroconductive body extending from the connection portion, wherein the connection portion and the extension portion extend linearly and parallel to each other in plane view, and the extension portion formed of the electroconductive magnetic body extending from the thermoelectric conversion portion and the connection portion are layered, or the extension portion formed of the electroconductive body extending from the connection portion and the thermoelectric conversion portion are layered.

2. The thermoelectric conversion element according to claim 1, wherein the thermoelectric conversion portion has a specific resistance of $1\times10^{-2}$ Ω·cm or less.

3. The thermoelectric conversion element according to claim 1, wherein the extension portion is formed of the electroconductive magnetic body extending from the thermoelectric conversion portion, and the extension portion and the connection portion are layered.

4. The thermoelectric conversion element according to claim 3, wherein where a value Rm is obtained by dividing a specific resistance of the extension portion by a thickness of the extension portion, and a value Rc is obtained by dividing a specific resistance of the connection portion by a thickness of the connection portion, Rm and Rc satisfy Rc/Rm≤3.

5. The thermoelectric conversion element according to claim 1, wherein a value Rc obtained by dividing a specific resistance of the connection portion by a thickness of the connection portion is 100Ω or less.

6. The thermoelectric conversion element according to claim 1, wherein the connection portion has a specific resistance of $1\times10^{-3}$ Ω·cm or less.

7. The thermoelectric conversion element according to claim 1, wherein the thermoelectric conversion portion or the connection portion forms a meander pattern together with the extension portion.

8. The thermoelectric conversion element according to claim 1, comprising a flexible substrate, wherein the thermoelectric conversion portion, the connection portion, and the extension portion are disposed on the flexible substrate.

9. A method for manufacturing a thermoelectric conversion element, the method comprising:

forming a thermoelectric conversion portion, a connection portion, and an extension portion by etching a layered body comprising a first layer and a second layer, the first layer comprising an electroconductive magnetic body having ferromagnetism or antiferromagnetism and capable of exhibiting an anomalous Nernst effect, and the second layer comprising an electroconductive body, the thermoelectric conversion portion comprising the electroconductive magnetic body and linearly extending;

the connection portion comprising the electroconductive body and being electrically connected to the thermoelectric conversion portion; and the extension portion being formed of the electroconductive magnetic body extending from the thermoelectric conversion portion or formed of the electroconductive body extending from the connection portion, wherein the thermoelectric conversion portion, the connection portion, and the extension portion are formed so that the extension portion formed of the electroconductive magnetic body extending from the thermoelectric conversion portion and the connection portion are layered, or that the extension portion formed of the electroconductive body extending from the connection portion and the thermoelectric conversion portion are layered.

10. The method according to claim 9, comprising successively forming the first layer and the second layer in a state isolated from the atmosphere.

11. The method according to claim 10, wherein the first layer and the second layer are formed by magnetron sputtering.

* * * * *